(12) United States Patent
Wang et al.

(10) Patent No.: US 11,335,877 B2
(45) Date of Patent: May 17, 2022

(54) ORGANIC LIGHT EMITTING DIODE ARRAY SUBSTRATE, DISPLAY PANEL AND DISPLAY APPARATUS, AND FABRICATING METHOD THEREOF

(71) Applicant: BOE Technology Group Co., Ltd., Beijing (CN)

(72) Inventors: Guoying Wang, Beijing (CN); Zhen Song, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 619 days.

(21) Appl. No.: 16/330,518

(22) PCT Filed: Mar. 12, 2018

(86) PCT No.: PCT/CN2018/078713
§ 371 (c)(1),
(2) Date: Mar. 5, 2019

(87) PCT Pub. No.: WO2019/173946
PCT Pub. Date: Sep. 19, 2019

(65) Prior Publication Data
US 2021/0359247 A1    Nov. 18, 2021

(51) Int. Cl.
*H01L 51/52* (2006.01)
*H01L 27/32* (2006.01)
(Continued)

(52) U.S. Cl.
CPC ...... *H01L 51/5228* (2013.01); *H01L 27/3246* (2013.01); *H01L 51/0023* (2013.01);
(Continued)

(58) Field of Classification Search
CPC ............. H01L 51/5228; H01L 51/0023; H01L 51/5225; H01L 51/5234; H01L 51/56; H01L 27/3246; H01L 2227/323
(Continued)

(56) References Cited

U.S. PATENT DOCUMENTS

| 2009/0096371 | A1* | 4/2009 | Matsudate | .......... H01L 27/3276 |
| | | | | 313/505 |
| 2012/0228592 | A1 | 9/2012 | Yokoyama et al. | |

(Continued)

FOREIGN PATENT DOCUMENTS

| CN | 103123956 A | 5/2013 |
| CN | 106449726 A | 2/2017 |

(Continued)

OTHER PUBLICATIONS

International Search Report & Written Opinion dated Dec. 5, 2018, regarding PCT/CN2018/078713.

(Continued)

*Primary Examiner* — Quoc D Hoang
(74) *Attorney, Agent, or Firm* — Intellectual Valley Law, P.C.

(57) ABSTRACT

The present application discloses an organic light emitting diode array substrate having a subpixel region and an inter-subpixel region. The organic light emitting diode array substrate in the inter-subpixel region includes a first base substrate; a pixel definition layer on the first base substrate for defining a plurality of subpixels; a spacer layer on a side of the pixel definition layer distal to the first base substrate; an auxiliary electrode layer on a side of the spacer layer distal to the pixel definition layer; and a second electrode layer on a side of the auxiliary electrode layer distal to the spacer layer and is electrically connected to the auxiliary electrode layer.

16 Claims, 12 Drawing Sheets

(51) Int. Cl.
  *H01L 51/00* (2006.01)
  *H01L 51/56* (2006.01)
(52) U.S. Cl.
  CPC ...... *H01L 51/5225* (2013.01); *H01L 51/5234* (2013.01); *H01L 51/56* (2013.01); *H01L 2227/323* (2013.01)
(58) Field of Classification Search
  USPC .......................................................... 257/40
  See application file for complete search history.

(56) References Cited

U.S. PATENT DOCUMENTS

| | | |
|---|---|---|
| 2014/0110674 A1 | 4/2014 | Choe |
| 2015/0372253 A1* | 12/2015 | Hong .................. H01L 51/5253 257/40 |
| 2018/0019434 A1 | 1/2018 | Park et al. |

FOREIGN PATENT DOCUMENTS

| | | |
|---|---|---|
| CN | 106992204 A | 7/2017 |
| CN | 107634147 A | 1/2018 |
| EP | 1096568 A2 | 5/2001 |

OTHER PUBLICATIONS

The Extended European Search Report in the European Patent Application No. 18855146.9, dated Oct. 5, 2021.

* cited by examiner

ORGANIC LIGHT EMITTING DIODE ARRAY SUBSTRATE, DISPLAY PANEL AND DISPLAY APPARATUS, AND FABRICATING METHOD THEREOF

CROSS-REFERENCE TO RELATED APPLICATION

This application is a national stage application under 35 U.S.C. § 371 of International Application No. PCT/CN2018/078713, filed Mar. 12, 2018, the contents of which are incorporated by reference in the entirety.

TECHNICAL FIELD

The present invention relates to display technology, more particularly, to an organic light emitting diode array substrate, an organic light emitting diode display panel, an organic light emitting diode display apparatus, and a method of fabricating an organic light emitting diode display panel.

BACKGROUND

Organic light emitting diode (OLED) display apparatuses are self-emissive devices, and do not require backlights. OLED display apparatuses also provide more vivid colors and a larger color gamut as compared to the conventional liquid crystal display (LCD) apparatuses. Further, OLED display apparatuses can be made more flexible, thinner, and lighter than a typical LCD.

SUMMARY

In one aspect, the present invention provides an organic light emitting diode array substrate having a subpixel region and an inter-subpixel region; wherein the organic light emitting diode array substrate in the inter-subpixel region comprises a first base substrate; a pixel definition layer on the first base substrate for defining a plurality of subpixels; a spacer layer on a side of the pixel definition layer distal to the first base substrate; an auxiliary electrode layer on a side of the spacer layer distal to the pixel definition layer; and a second electrode layer on a side of the auxiliary electrode layer distal to the spacer layer and is electrically connected to the auxiliary electrode layer.

Optionally, orthographic projections of the spacer layer and the auxiliary electrode layer on the pixel definition layer at least partially overlap with each other.

Optionally, an orthographic projection of the auxiliary electrode layer on the pixel definition layer substantially covers an orthographic projection of the spacer layer on the pixel definition layer.

Optionally, the organic light emitting diode array substrate in the subpixel region comprises the first base substrate; a first electrode layer on the first base substrate; an organic light emitting layer on a side of the first electrode layer distal to the first base substrate; and the second electrode layer on a side of the organic light emitting layer distal to the first electrode layer.

Optionally, the spacer layer comprises a plurality of spacer blocks, each of which is on a side of the pixel definition layer distal to the first base substrate; the auxiliary electrode layer comprises a plurality of auxiliary electrode blocks, each of which is on a side of one of the plurality of spacer blocks distal to the pixel definition layer; the organic light emitting layer extends into the inter-subpixel region and is between the second electrode layer and one of the plurality of auxiliary electrode blocks in the inter-subpixel region; the organic light emitting diode array substrate comprises a plurality of vias extending through the organic light emitting layer in the inter-subpixel region; and the one of the plurality of auxiliary electrode blocks in the inter-subpixel region is electrically connected to the second electrode layer through the plurality of vias.

Optionally, the one of the plurality of auxiliary electrode blocks comprises a plurality of protrusions on a side proximal to the second electrode layer and distal to the first base substrate; and the plurality of protrusions respectively protrude through the plurality of vias in the organic light emitting layer in the inter-subpixel region thereby electrically connecting the second electrode layer and the one of the plurality of auxiliary electrode blocks.

Optionally, average dimensions of the plurality of protrusions are in a range of approximately 10 nm to approximately 100 nm.

Optionally, an orthographic projection of each of the plurality of auxiliary electrode blocks on the pixel definition layer at least partially overlaps with an orthographic projection of one of the plurality of spacer blocks on the pixel definition layer.

Optionally, an orthographic projection of each of the plurality of auxiliary electrode blocks on the pixel definition layer substantially covers an orthographic projection of one of the plurality of spacer blocks on the pixel definition layer.

Optionally, the second electrode layer comprises a substantially transparent electrode material; and the auxiliary electrode layer comprises a metallic material.

In another aspect, the present invention provides an organic light emitting diode display panel, comprising the organic light emitting diode array substrate described herein or fabricated by a method described herein; and a counter substrate facing the organic light emitting diode array substrate; wherein the spacer layer is configured to maintain a spacing between the organic light emitting diode array substrate and the counter substrate.

Optionally, the spacer layer comprises a plurality of spacer blocks, each of which is on a side of the pixel definition layer distal to the first base substrate; and the auxiliary electrode layer comprises a plurality of auxiliary electrode blocks, each of which is on a side of one of the plurality of spacer blocks distal to the pixel definition layer; wherein the counter substrate comprises a second base substrate; and an overcoat layer on the second base substrate; wherein the overcoat layer is direct contact with the organic light emitting diode array substrate in each of a plurality of regions having the plurality of spacer blocks.

Optionally, the overcoat layer is in direct contact with the second electrode layer in each of the plurality of regions having the plurality of spacer blocks.

In another aspect, the present invention provides an organic light emitting diode display apparatus, comprising the organic light emitting diode display panel described herein or fabricated by a method described herein.

In another aspect, the present invention provides a method of fabricating an organic light emitting diode display panel, comprising forming an organic light emitting diode array substrate having a subpixel region and an inter-subpixel region; wherein forming the organic light emitting diode array substrate in the inter-subpixel region comprises forming a pixel definition layer on a first base substrate for defining a plurality of subpixels; forming a spacer layer on a side of the pixel definition layer distal to the first base substrate; forming an auxiliary electrode layer on a side of the spacer layer distal to the pixel definition layer; and forming a second electrode layer on a side of the auxiliary electrode layer distal to the spacer layer and is electrically connected to the auxiliary electrode layer.

Optionally, forming the spacer layer comprises forming a plurality of spacer blocks on the pixel definition layer; forming the auxiliary electrode layer comprises forming an electrode material layer on a side of the spacer layer distal to the first base substrate; and forming a plurality of protrusions on a surface of the electrode material layer distal to the first base substrate.

Optionally, forming the plurality of protrusions comprises dry etching a surface of the electrode material layer.

Optionally, subsequent to forming the plurality of protrusions, the method further comprises patterning the electrode material layer to form a plurality of auxiliary electrode blocks thereby forming the auxiliary electrode layer.

Optionally, forming the organic light emitting diode array substrate in the subpixel region comprises forming a first electrode layer on the first base substrate; forming an organic light emitting layer on a side of the first electrode layer distal to the first base substrate; and forming the second electrode layer on a side of the organic light emitting layer distal to the first electrode layer; wherein the organic light emitting layer is formed to extend into the inter-subpixel region and is formed between the second electrode layer and one of the plurality of auxiliary electrode blocks in the inter-subpixel region.

Optionally, the method further comprises forming a counter substrate; and assembling the organic light emitting diode array substrate and the counter substrate together; wherein assembling the organic light emitting diode array substrate and the counter substrate together comprises pressing the organic light emitting diode array substrate and the counter substrate against each other; and the plurality of protrusions penetrate through the organic light emitting layer during pressing, thereby increasing contact and electrical connection between the auxiliary electrode layer and the second electrode layer.

BRIEF DESCRIPTION OF THE FIGURES

The following drawings are merely examples for illustrative purposes according to various disclosed embodiments and are not intended to limit the scope of the present invention.

DETAILED DESCRIPTION

Figure 1A:
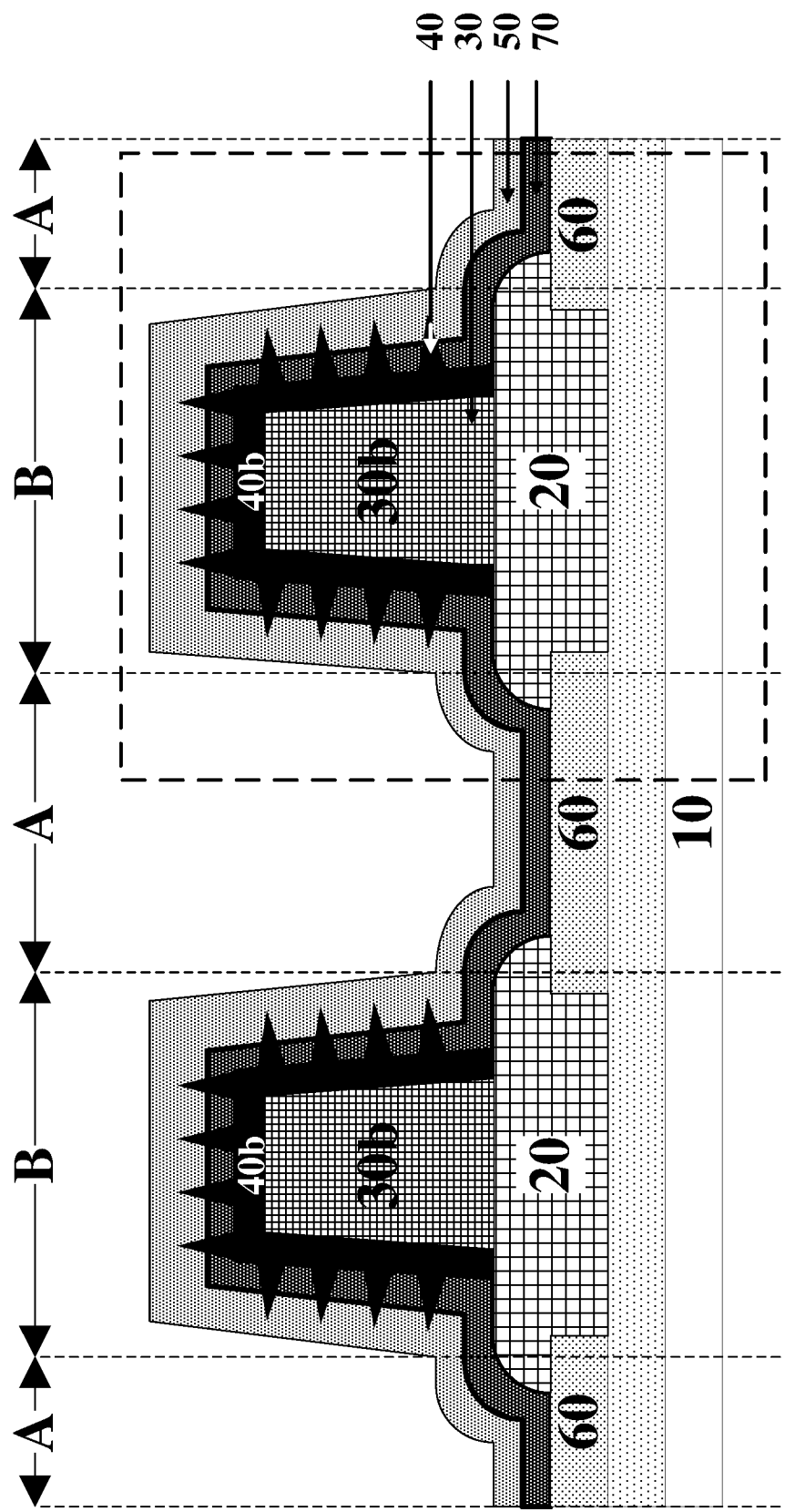
FIG. 1A is a schematic diagram illustrating the structure of an organic light emitting diode array substrate in some embodiments according to the present disclosure.

The disclosure will now be described more specifically with reference to the following embodiments. It is to be noted that the following descriptions of some embodiments are presented herein for purpose of illustration and description only. It is not intended to be exhaustive or to be limited to the precise form disclosed.

In conventional organic light emitting diode display panels, particularly in top emission-type organic light emitting diode display panels, an auxiliary electrode layer is formed in a counter substrate facing an organic light emitting diode array substrate. In some conventional organic light emitting diode display panels, a spacer layer is also formed on the counter substrate, and the auxiliary electrode layer is formed on a side of the spacer layer distal to a base substrate of the counter substrate. The auxiliary electrode layer in the counter substrate has poor adhesion with either the spacer layer or an overcoat layer of the counter substrate, resulting defects in the conventional organic light emitting diode display panels. The above-described conventional organic light emitting diode display panels also require a complicated fabricating process and relatively high costs.

Accordingly, the present disclosure provides, inter alia, an organic light emitting diode array substrate, an organic light emitting diode display panel, an organic light emitting diode display apparatus, and a method of fabricating an organic light emitting diode display panel that substantially obviate one or more of the problems due to limitations and disadvantages of the related art. In one aspect, the present disclosure provides an organic light emitting diode array substrate having a subpixel region and an inter-subpixel region. In some embodiments, the organic light emitting diode array substrate in the inter-subpixel region includes a first base substrate; a pixel definition layer on the first base substrate for defining a plurality of subpixels; a spacer layer on a side of the pixel definition layer distal to the first base substrate; an auxiliary electrode layer on a side of the spacer layer distal to the pixel definition layer; and a second electrode layer on a side of the auxiliary electrode layer distal to the spacer layer and is electrically connected to the auxiliary electrode layer. In each of the plurality of subpixels, the organic light emitting diode array substrate includes an organic light emitting diode having at least the first electrode layer, the organic light emitting layer, and the second electrode layer.

As used herein, a subpixel region refers to a light emission region of a subpixel, such as a region corresponding to a pixel electrode in a liquid crystal display, or a region corresponding to a light emissive layer in an organic light emitting diode display panel. Optionally, a pixel may include a number of separate light emission regions corresponding to a number of subpixels in the pixel. Optionally, the subpixel region is a light emission region of a red color subpixel. Optionally, the subpixel region is a light emission region of a green color subpixel. Optionally, the subpixel region is a light emission region of a blue color subpixel. Optionally, the subpixel region is a light emission region of a white color subpixel. As used herein, an inter-subpixel region refers to a region between adjacent subpixel regions, such as a region corresponding to a black matrix in a liquid crystal display, or a region corresponding a pixel definition layer in an organic light emitting diode display panel.

Optionally, the inter-subpixel region is a region between adjacent subpixel regions in a same pixel. Optionally, the inter-subpixel region is a region between two adjacent subpixel regions from two adjacent pixels. Optionally, the inter-subpixel region is a region between a subpixel region of a red color subpixel and a subpixel region of an adjacent green color subpixel. Optionally, the inter-subpixel region is a region between a subpixel region of a red color subpixel and a subpixel region of an adjacent blue color subpixel. Optionally, the inter-subpixel region is a region between a subpixel region of a green color subpixel and a subpixel region of an adjacent blue color subpixel.

FIG. 1A is a schematic diagram illustrating the structure of an organic light emitting diode array substrate in some embodiments according to the present disclosure. Referring to FIG. 1A, the organic light emitting diode array substrate in some embodiments has a subpixel region A and an inter-subpixel region B. In some embodiments, the organic light emitting diode array substrate in the inter-subpixel region B includes a first base substrate 10; a pixel definition layer 20 on the first base substrate 10 for defining a plurality of subpixels; a spacer layer 30 on a side of the pixel definition layer 20 distal to the first base substrate 10; an auxiliary electrode layer 40 on a side of the spacer layer 30 distal to the pixel definition layer 20; and a second electrode layer 50 on a side of the auxiliary electrode layer 40 distal to the spacer layer 30 and is electrically connected to the auxiliary electrode layer 40. The spacer layer 30 is configured to maintain a spacing between the organic light emitting diode array substrate and a counter substrate in an organic light emitting diode display panel.

In some embodiments, orthographic projections of the spacer layer 30 and the auxiliary electrode layer 40 on the pixel definition layer 20 at least partially overlap with each other. Optionally, an orthographic projection of the auxiliary electrode layer 40 on the pixel definition layer 20 substantially covers an orthographic projection of the spacer layer 30 on the pixel definition layer 20. Optionally, the orthographic projection of the auxiliary electrode layer 40 on the pixel definition layer 20 substantially overlaps with the orthographic projection of the spacer layer 30 on the pixel definition layer 20. Optionally, an orthographic projection of the pixel definition layer 20 on the first base substrate 10 substantially covers orthographic projections of the spacer layer 30 and the auxiliary electrode layer 40 on the first base substrate 10.

In some embodiments, the organic light emitting diode array substrate in the subpixel region A includes the first base substrate 10; a first electrode layer 60 on the first base substrate 10; an organic light emitting layer 70 on a side of the first electrode layer 60 distal to the first base substrate 10; and the second electrode layer 50 on a side of the organic light emitting layer 70 distal to the first electrode layer 60. Optionally, the second electrode layer 50 is an electrode layer extending throughout the subpixel region A and the inter-subpixel region B. Optionally, the second electrode layer 50 is a substantially transparent electrode layer. As used herein, the term "substantially transparent" mean at least 50 percent (e.g., at least 60 percent, at least 70 percent, at least 80 percent, at least 90 percent, and at least 95 percent) of light in the visible wavelength range transmitted therethrough.

In some embodiments, the spacer layer 30 includes a plurality of spacer blocks 30b, each of which is on a side of the pixel definition layer 20 distal to the first base substrate 10. In some embodiments, the auxiliary electrode layer 40 includes a plurality of auxiliary electrode blocks 40b, each of which is on a side of one of the plurality of spacer blocks 30b distal to the pixel definition layer 20. Optionally, an orthographic projection of each of the plurality of auxiliary electrode blocks 40b on the pixel definition layer 20 at least partially overlaps with an orthographic projection of one of the plurality of spacer blocks 30b on the pixel definition layer 20. Optionally, an orthographic projection of each of the plurality of auxiliary electrode blocks 40b on the pixel definition layer 20 substantially covers an orthographic projection of one of the plurality of spacer blocks 30b on the pixel definition layer 20. Optionally, the orthographic projection of each of the plurality of auxiliary electrode blocks 40b on the pixel definition layer 20 substantially overlaps with the orthographic projection of one of the plurality of spacer blocks 30b on the pixel definition layer 20.

Figure 1B:
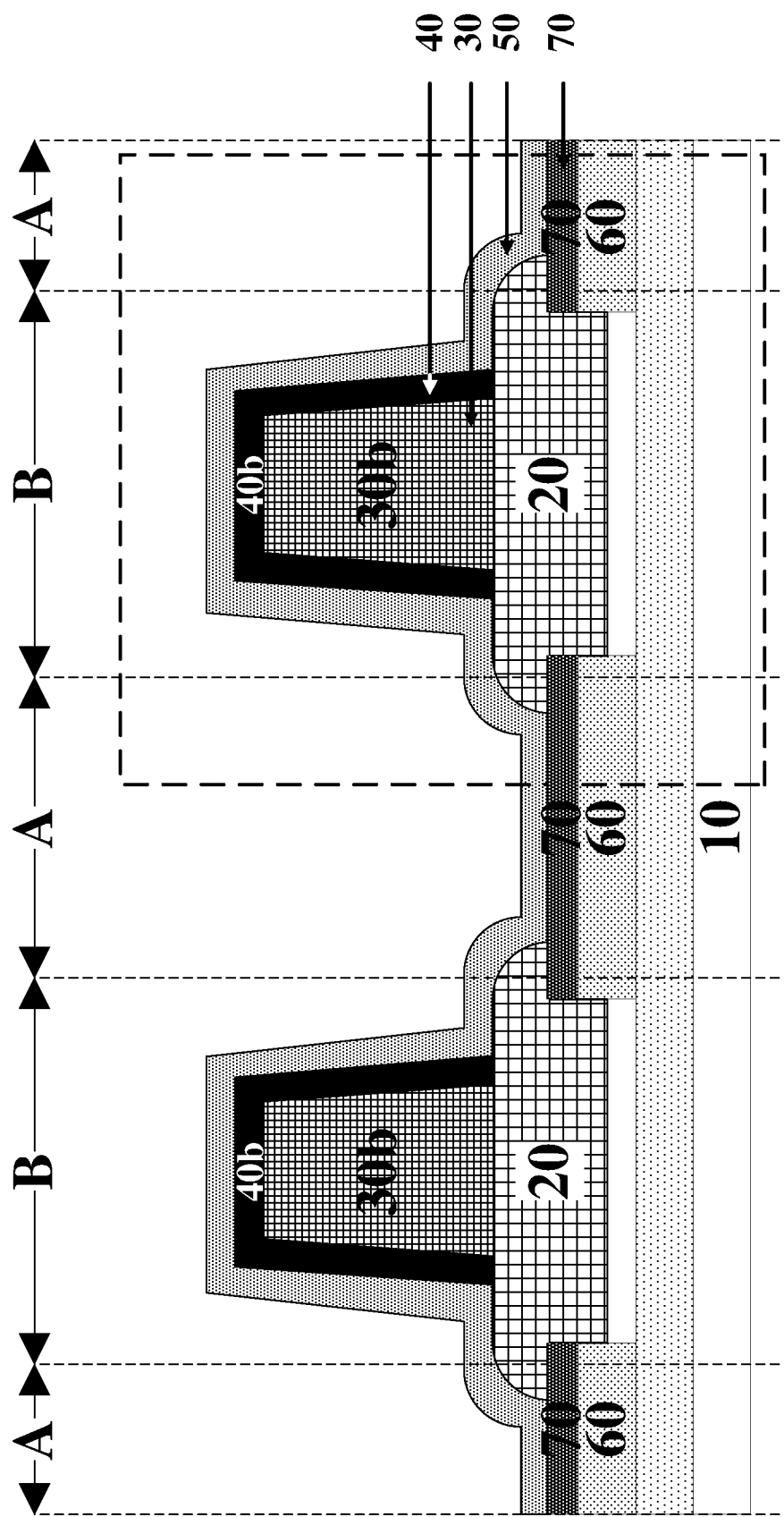
FIG. 1B is a schematic diagram illustrating the structure of an organic light emitting diode array substrate in some embodiments according to the present disclosure.

In some embodiments, the organic light emitting layer 70 is substantially absent in the inter-subpixel region B. FIG. 1B is a schematic diagram illustrating the structure of an organic light emitting diode array substrate in some embodiments according to the present disclosure. Referring to FIG. 1B, the organic light emitting layer 70 is substantially limited to the subpixel region A, and is substantially absent in the inter-subpixel region B. In the inter-subpixel region B, the auxiliary electrode layer 40 includes a plurality of auxiliary electrode blocks 40b, each of which is on a side of one of the plurality of spacer blocks 30b distal to the pixel definition layer 20. Each of the plurality of auxiliary electrode blocks 40b is in direct contact with the second electrode layer 50 without any intervening layer or structure.

Figure 2A:
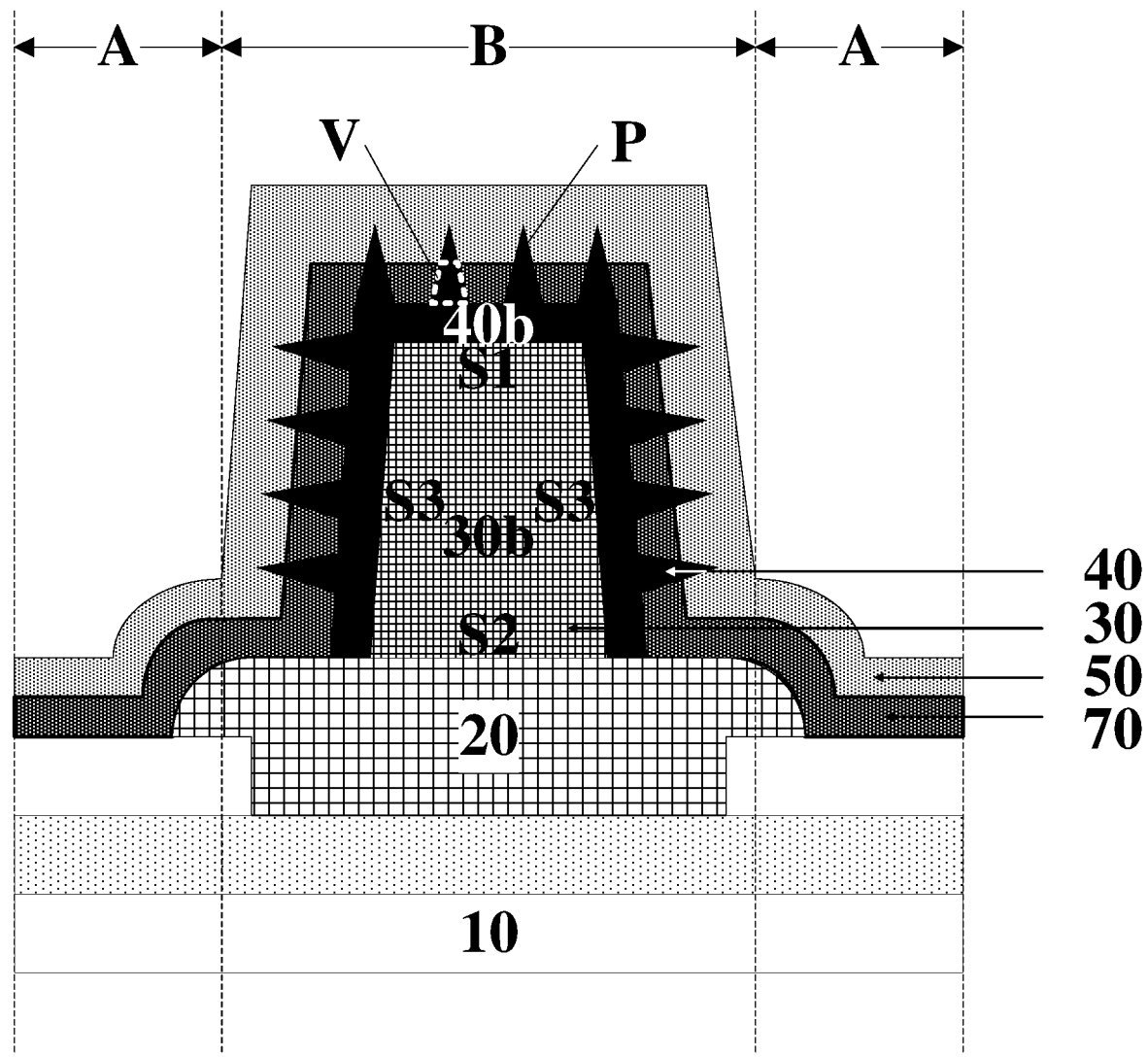
FIG. 2A is a zoom-in view of the region circled by dashed lines in FIG. 1A.

In some embodiments, the organic light emitting layer 70 at least partially extends into the inter-subpixel region B. Referring to FIG. 1A, in some embodiments, the organic light emitting layer 70 in the inter-subpixel region B is between the second electrode layer 50 and one of the plurality of auxiliary electrode blocks 40b. FIG. 2A is a zoom-in view of the region circled by dashed lines in FIG. 1A. Referring to FIG. 2A, the organic light emitting diode array substrate includes a plurality of vias V extending through the organic light emitting layer 70 in the inter-subpixel region B, and the one of the plurality of auxiliary electrode blocks 40 b in the inter-subpixel region B is electrically connected to the second electrode layer 50 through the plurality of vias V.

In some embodiments, the one of the plurality of auxiliary electrode blocks 40b includes a plurality of protrusions P on a side proximal to the second electrode layer 50 and distal to the first base substrate 10. Optionally, the plurality of protrusions P respectively protrude through the plurality of vias V in the organic light emitting layer 70 in the inter-subpixel region B thereby electrically connecting the second electrode layer 50 and the one of the plurality of auxiliary electrode blocks 40b.

In some embodiments, each of the plurality of spacer blocks 30b has a first side S1, a second side S2 opposite to the first side S1, and a third side S3 connecting the first side S1 and the second side S2. The first side S1 is distal to the pixel definition layer 20 and proximal to the second electrode layer 50. The second side S2 is proximal to the pixel definition layer 20 and distal to the second electrode layer 50. In some embodiments, the plurality of protrusions P of the one of the plurality of auxiliary electrode blocks 40b are on a side of the first side S1 proximal to the second electrode layer 50 and distal to the one of the plurality of spacer blocks 30b, as well as on a side of the third side S3 proximal to the second electrode layer 50 and distal to the one of the plurality of spacer blocks 30b.

Figure 2B:
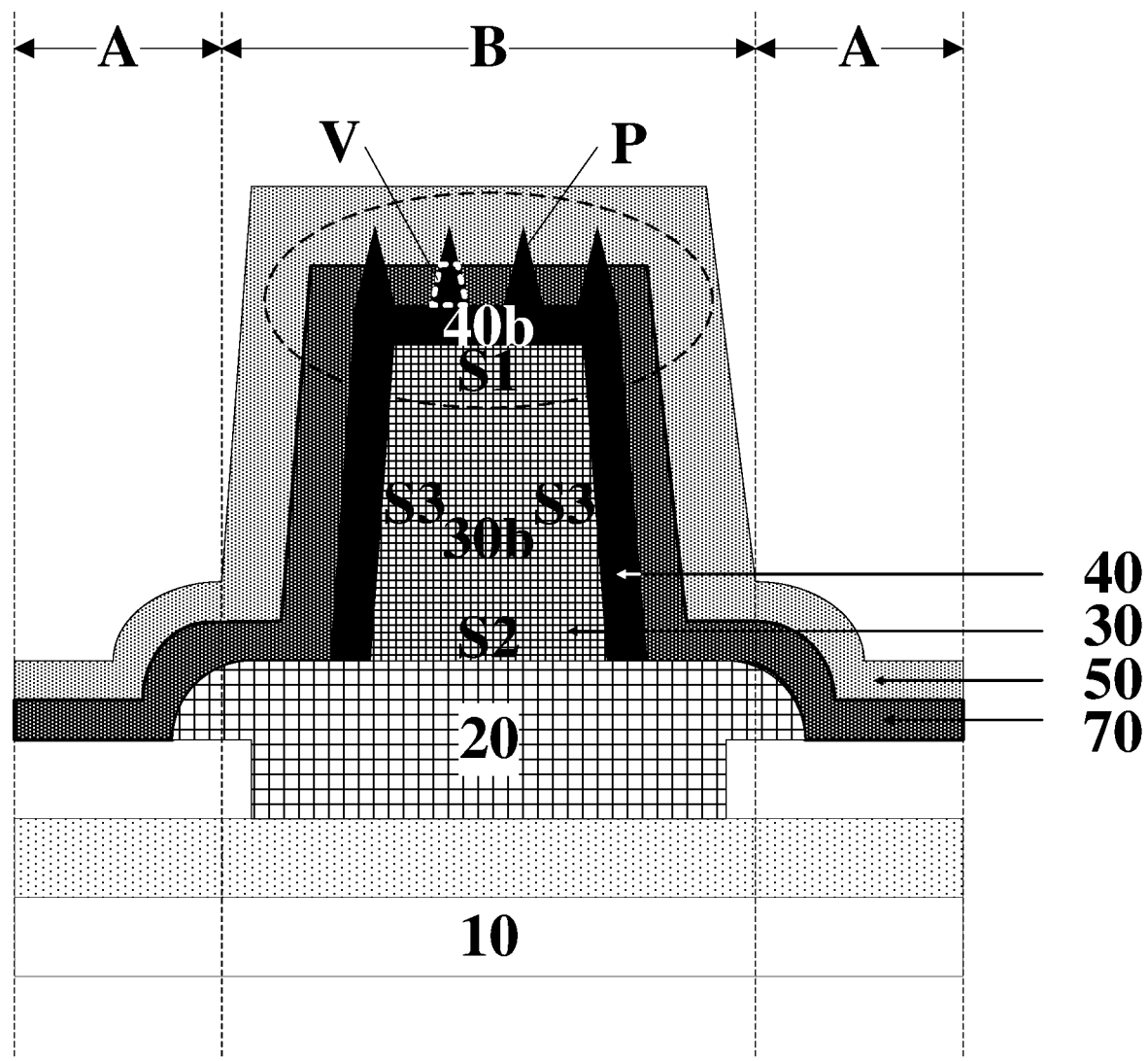
FIG. 2B is a zoom-in cross-sectional view of a region of an organic light emitting diode array substrate in some embodiments according to the present disclosure.

FIG. 2B is a zoom-in cross-sectional view of a region of an organic light emitting diode array substrate in some embodiments according to the present disclosure. Referring to FIG. 2B, in some embodiments, the plurality of protrusions P of the one of the plurality of auxiliary electrode blocks 40b are substantially limited to a region between the first side S1 and the second electrode layer 50, e.g., on a side of the first side S1 proximal to the second electrode layer 50 and distal to the one of the plurality of spacer blocks 30b. The plurality of protrusions P of the one of the plurality of auxiliary electrode blocks 40b are substantially absent in a region between the third side S3 and the second electrode layer 50, e.g., absent on a side of the third side S3 proximal to the second electrode layer 50 and distal to the one of the plurality of spacer blocks 30b.

The plurality of protrusions P of the one of the plurality of auxiliary electrode blocks 40b have a thickness greater than a thickness of the organic light emitting layer 70. Optionally, the average dimensions of the plurality of protrusions are in a range of approximately 10 nm to approximately 100 nm. Optionally, the average thickness of the plurality of protrusions are in a range of approximately 10 nm to approximately 100 nm.

Figure 2C:
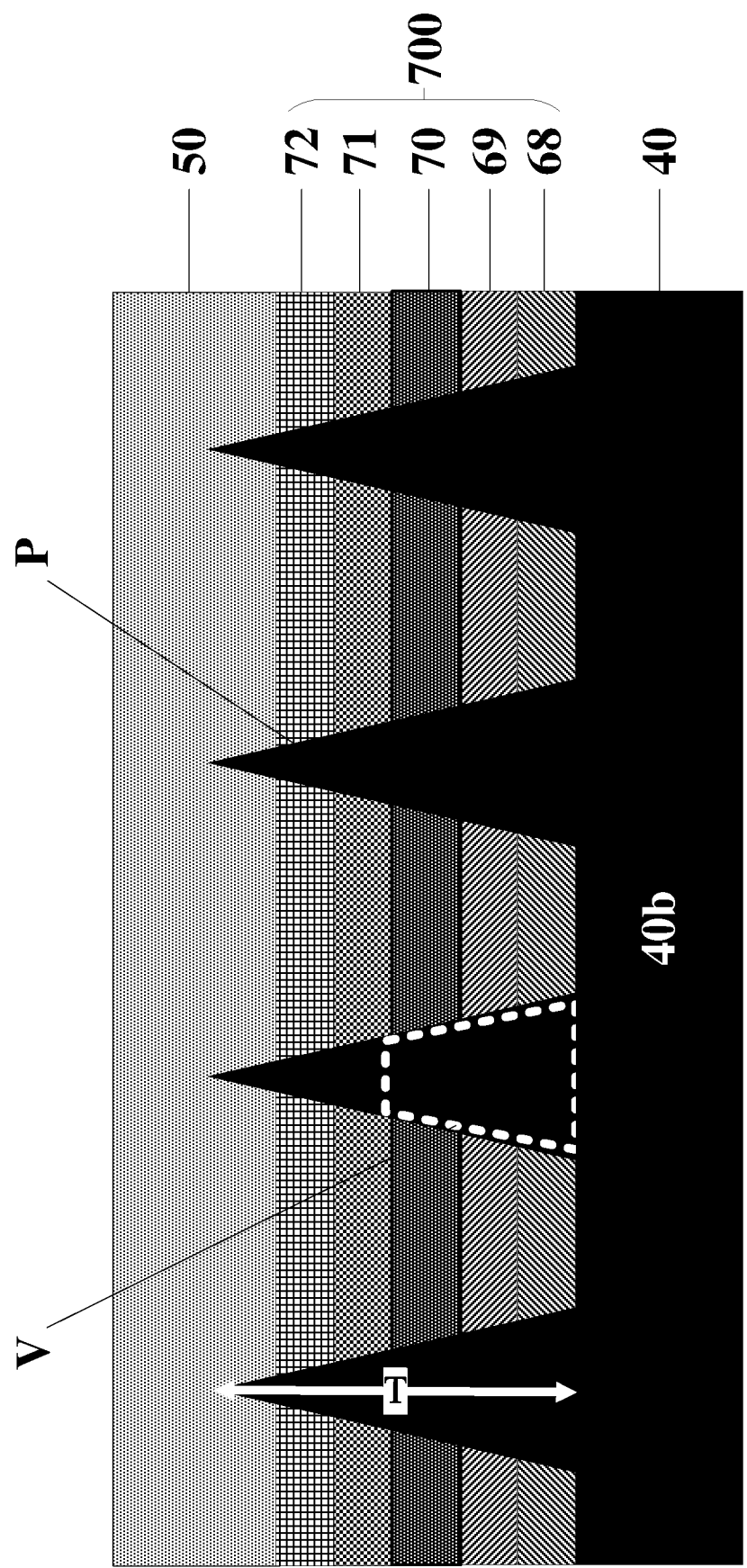
FIG. 2C is a zoom-in view of the region circled by dashed lines in FIG. 2B.

FIG. 2C is a zoom-in view of the region circled by dashed lines in FIG. 2B. Referring to FIG. 2C, the organic light emitting diode array substrate in some embodiments further includes one or more organic functional layers. The organic light emitting layer 70 is one of the multiple layers of an organic layer 700. In one example, the organic layer 700 includes a hole injection layer 68 on a side of the auxiliary electrode layer 40 distal to the spacer layer 30, a hole transport layer 69 on a side of the hole injection layer 68 distal to the auxiliary electrode layer 40, an organic light emitting layer 70 on a side of the hole transport layer 69 distal to the hole injection layer 68, an electron transport layer 71 on a side of the organic light emitting layer 70 distal to the hole transport layer 69, and an electron injection layer 72 on a side of the electron transport layer 71 distal to the organic light emitting layer 70. The plurality of protrusions P of the one of the plurality of auxiliary electrode blocks 40b have a thickness T greater than a total thickness of the organic layer 700. Optionally, the thickness T of the plurality of protrusions are in a range of approximately 10 nm to approximately 100 nm.

In some embodiments, the organic light emitting diode array substrate is a top emission-type organic light emitting diode array substrate. Optionally, the second electrode layer 50 includes a substantially transparent electrode material, and the auxiliary electrode layer 40 includes a metallic material (e.g., metal, alloy, or laminate).

Various appropriate electrode materials and various appropriate fabricating methods may be used to make the auxiliary electrode layer 40. For example, an electrode material may be deposited on the substrate, e.g., by sputtering or vapor deposition or solution coating; and patterned. Examples of appropriate electrode materials for making the auxiliary electrode layer 40 include, but are not limited to, molybdenum, aluminum, titanium, gold, copper, hafnium, tantalum, alloys such as aluminum Neodymium (AlNd), molybdenum Niobium (MoNb), and laminates such as a molybdenum-aluminum-molybdenum laminated structure, a MoNb-copper-MoNb laminated structure, and a AlNd-molybdenum-AlNd laminated structure.

Various appropriate substantially transparent electrode materials and various appropriate fabricating methods may be used to make the second electrode layer 50. For example, an electrode material may be deposited on the substrate by a plasma-enhanced chemical vapor deposition (PECVD) process and patterned. Examples of appropriate substantially transparent electrode materials for making the second electrode layer 50 include, but are not limited to, indium tin oxide, indium zinc oxide, aluminum zinc oxide, indium gallium zinc oxide, aluminum zinc tin oxide, nano-metals such as nano-silver, conductive resins, graphene, carbon nanotubes, and the like.

Optionally, the first electrode layer is an anode of the organic light emitting diode, and the second electrode layer is a cathode of the organic light emitting diode. Optionally, the first electrode layer is a cathode of the organic light emitting diode, and the second electrode layer is an anode of the organic light emitting diode.

In another aspect, the present disclosure provides an organic light emitting diode display panel. In some embodiments, the organic light emitting diode display panel includes an organic light emitting diode array substrate described herein or fabricated by a method described herein, and a counter substrate facing the organic light emitting diode array substrate. The spacer layer 30 is configured to maintain a spacing between the organic light emitting diode array substrate and the counter substrate.

Figure 3A:
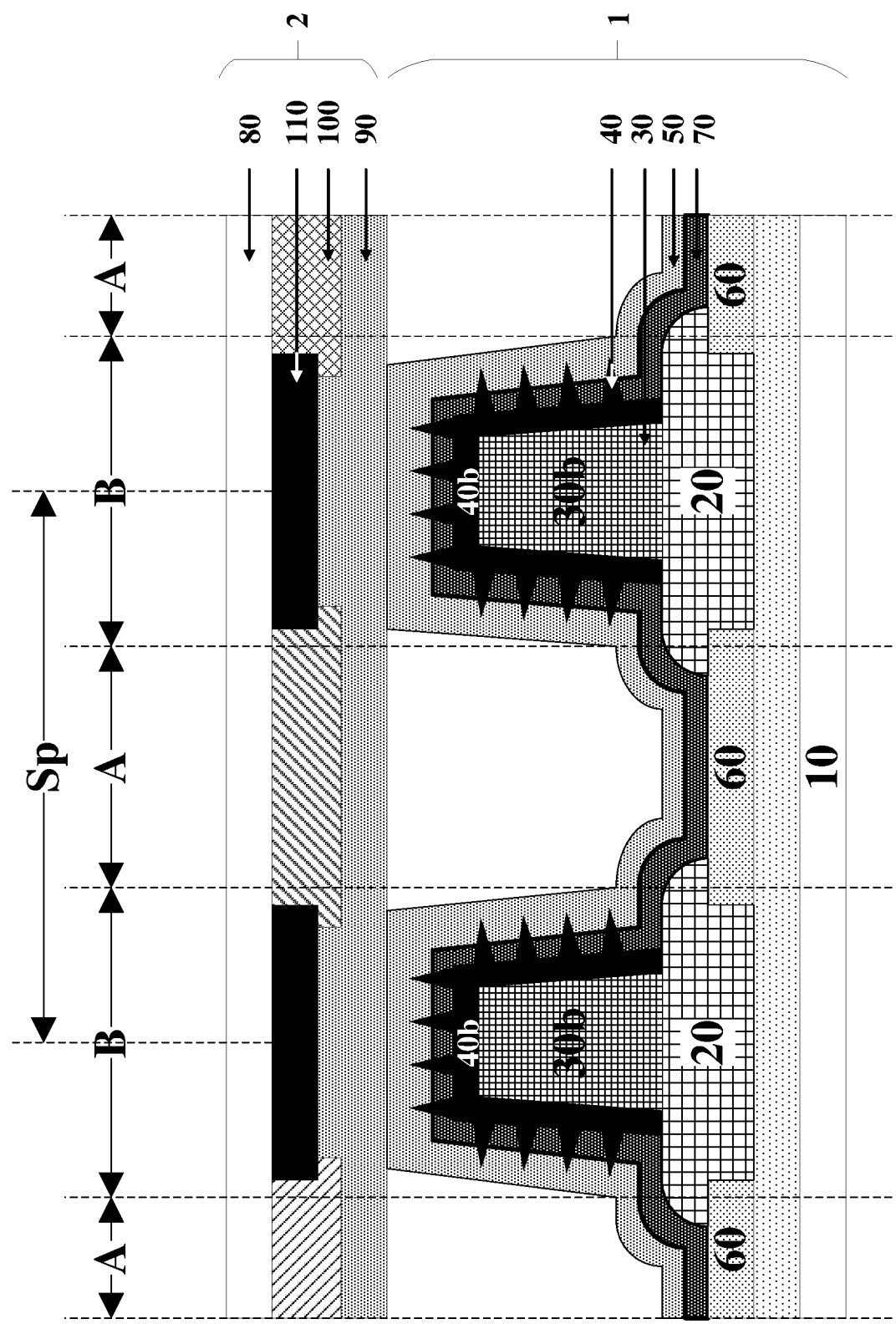
FIG. 3A is a schematic diagram illustrating the structure of an organic light emitting diode display panel in some embodiments according to the present disclosure.

FIG. 3A is a schematic diagram illustrating the structure of an organic light emitting diode display panel in some embodiments according to the present disclosure. Referring to FIG. 3A, the organic light emitting diode display panel includes an organic light emitting diode array substrate 1 and a counter substrate 2 facing the organic light emitting diode array substrate 1. The spacer layer 30 is configured to maintain a spacing between the organic light emitting diode array substrate 1 and the counter substrate 2. In some embodiments, the counter substrate 2 includes a second base substrate 80, and an overcoat layer 90 on the second base substrate 80. In the inter-subpixel region B, the counter substrate 2 further includes a black matrix layer 110 on the second base substrate 80. In the subpixel region A, the counter substrate 2 further includes a color filter 100 on the second base substrate 80. Optionally, an orthographic projection of the black matrix layer 110 on the first base substrate 10 substantially covers an orthographic projection of the auxiliary electrode layer 40 (e.g., the plurality of auxiliary electrode blocks 40b) on the first base substrate 10. Each subpixel Sp includes a subpixel region A surrounded by an inter-subpixel region B.

Figure 3B:
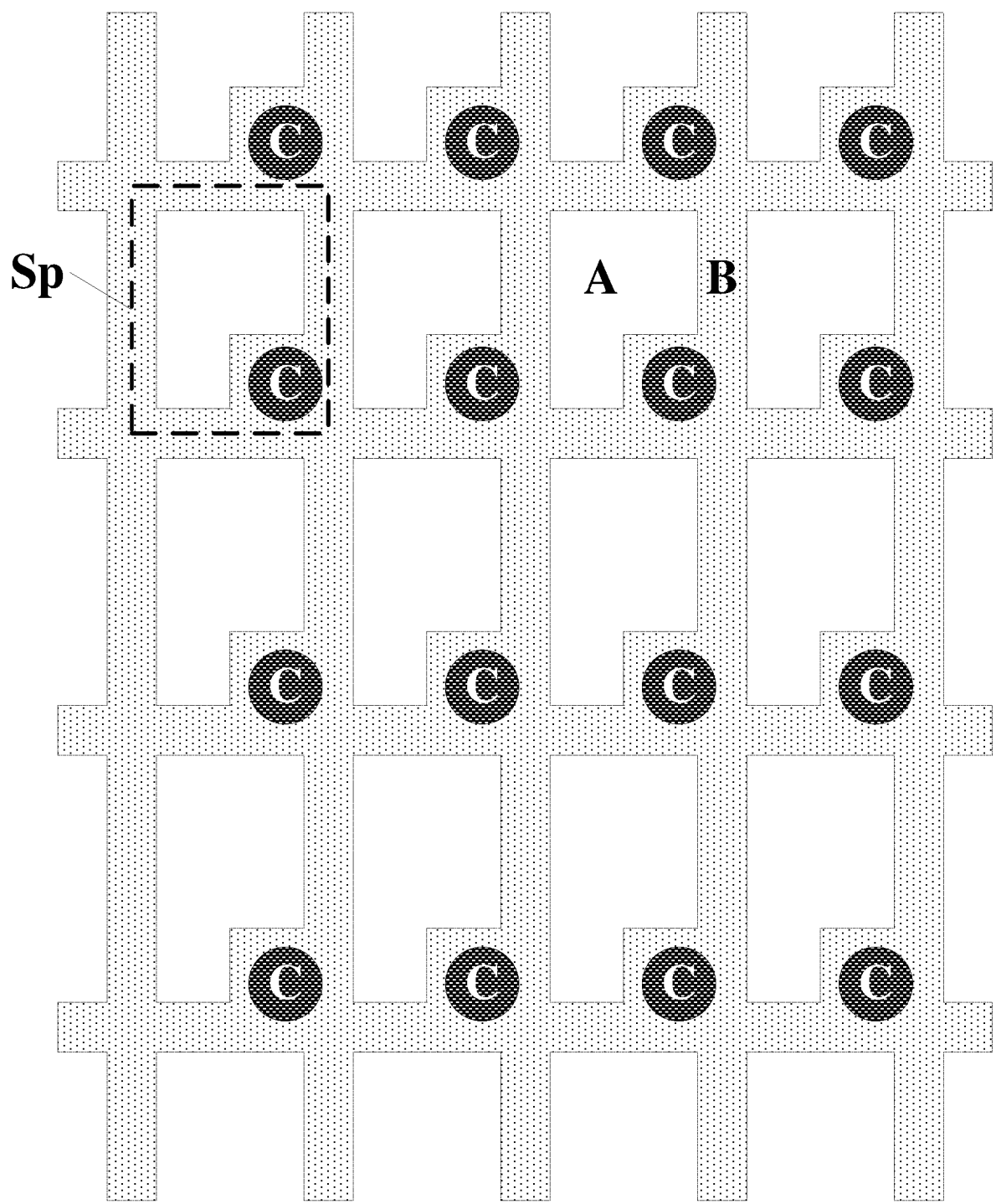
FIG. 3B is a plan view of an organic light emitting diode display panel in some embodiments according to the present disclosure.

FIG. 3B is a plan view of an organic light emitting diode display panel in some embodiments according to the present disclosure. Referring to FIG. 3B, the organic light emitting diode display panel in some embodiments has a subpixel region A and an inter-subpixel region B. Moreover, the organic light emitting diode display panel has a plurality of regions C in which the plurality of spacer blocks 30b are disposed, respectively. Referring to FIG. 3A and FIG. 3B, the overcoat layer 90 is direct contact with (e.g., without any intervening layer or structure) the organic light emitting diode array substrate 1 in each of the plurality of regions C having the plurality of spacer blocks 30b. Optionally, the overcoat layer 90 is direct contact with (e.g., without any intervening layer or structure) the second electrode layer 50 in the plurality of regions C of the organic light emitting diode array substrate 1 having the plurality of spacer blocks 30b. In FIG. 3B, the organic light emitting diode display panel has at least one of the plurality of regions C in each subpixel Sp.

Figure 3C:
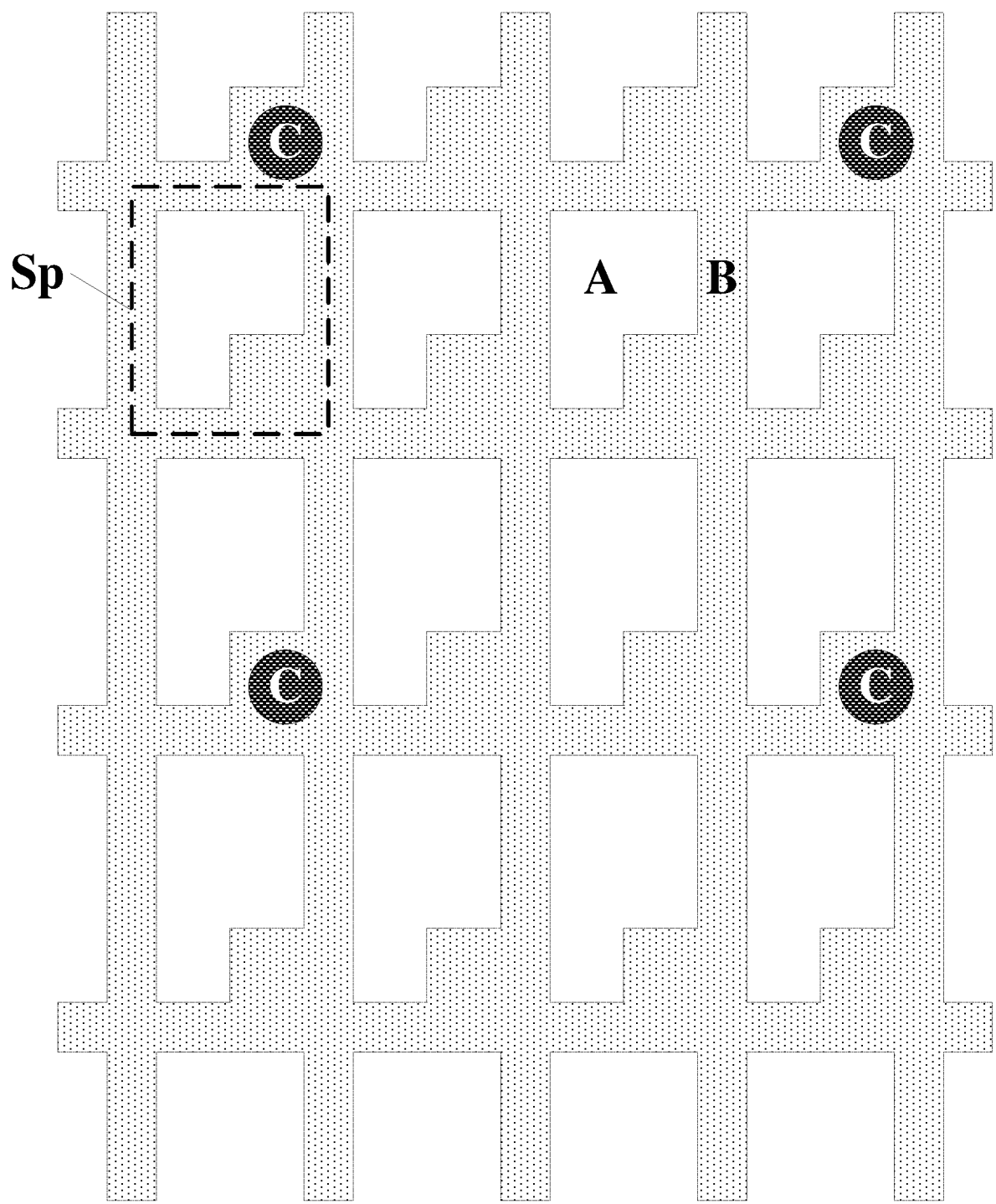
FIG. 3C is a plan view of an organic light emitting diode display panel in some embodiments according to the present disclosure.

In some embodiments, the organic light emitting diode display panel has one of the plurality of regions C in multiple ones of the subpixels Sp. FIG. 3C is a plan view of an organic light emitting diode display panel in some embodiments according to the present disclosure. Referring to FIG. 3C, the organic light emitting diode display panel has one of the plurality of regions C in every six ones of the subpixels Sp.

Optionally, the auxiliary electrode layer 40 is limited to the plurality of regions C. Optionally, the auxiliary electrode layer 40 is disposed in the plurality of regions C, and at least partially extends into the inter-subpixel region B. Optionally, the auxiliary electrode layer 40 extends throughout the inter-subpixel region B. The auxiliary electrode layer 40 is substantially absent in the subpixel region A.

In another aspect, the present disclosure provides a method of fabricating an organic light emitting diode display panel. In some embodiments, the method includes forming an organic light emitting diode array substrate having a subpixel region and an inter-subpixel region. In some embodiments, the step of forming the organic light emitting diode array substrate in the inter-subpixel region includes forming a pixel definition layer on a first base substrate for defining a plurality of subpixels; forming a spacer layer on a side of the pixel definition layer distal to the first base substrate; forming an auxiliary electrode layer on a side of the spacer layer distal to the pixel definition layer; and forming a second electrode layer on a side of the auxiliary electrode layer distal to the spacer layer and is electrically connected to the auxiliary electrode layer.

Figure 4A:
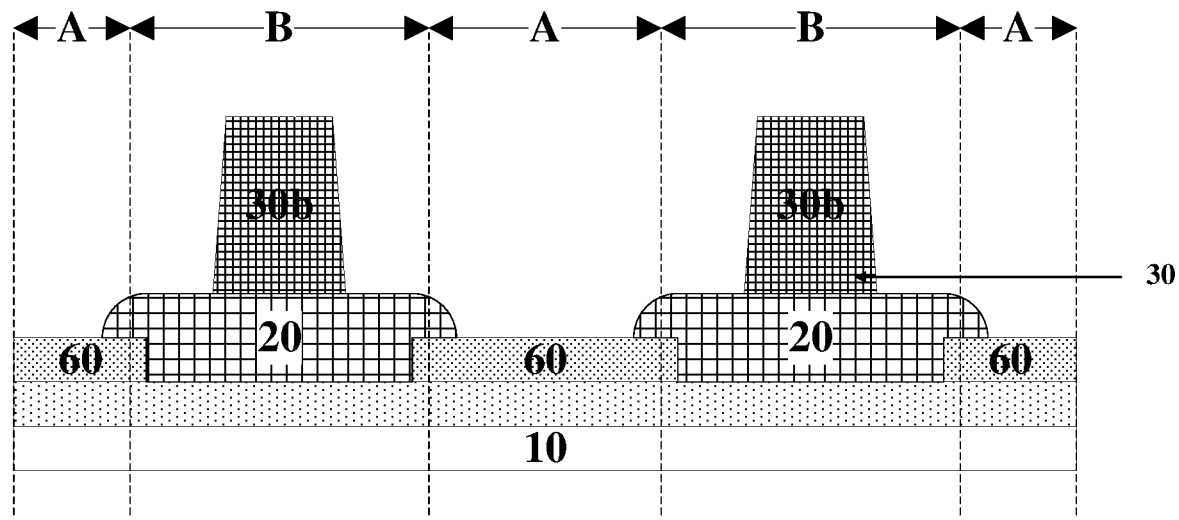
FIGS. 4A to 4H illustrate a process of fabricating an organic light emitting diode display panel in some embodiments according to the present disclosure.

FIGS. 4A to 4H illustrate a process of fabricating an organic light emitting diode display panel in some embodiments according to the present disclosure. Referring to FIG. 4A, a first electrode layer 60 is formed on the first base substrate 10 and in the subpixel region A, a pixel definition layer 20 is formed on the first base substrate 10 for defining a plurality of subpixels. The pixel definition layer 20 is formed in the inter-subpixel region B. Moreover, a spacer layer 30 is formed on a side of the pixel definition layer 20 distal to the first base substrate 10. The step of forming the spacer layer 30 includes forming a plurality of spacer blocks 30*b* on the pixel definition layer 20.

Figure 4B:
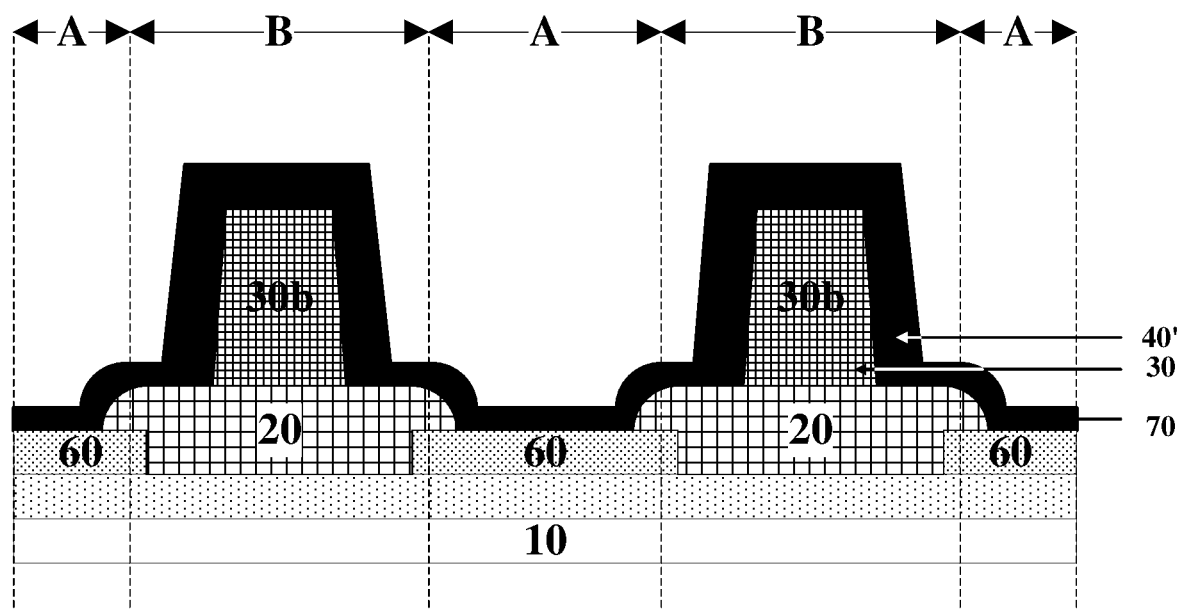

Referring to FIG. 4B, an electrode material layer 40' is formed on a side of the spacer layer 30 distal to the first base substrate 10. Various appropriate electrode materials and various appropriate fabricating methods may be used to make the electrode material layer 40'. For example, an electrode material may be deposited on the substrate, e.g., by sputtering or vapor deposition or solution coating; and patterned. Examples of appropriate electrode materials for making the electrode material layer 40' include, but are not limited to, molybdenum, aluminum, titanium, gold, copper, hafnium, tantalum, alloys such as aluminum Neodymium (AlNd), molybdenum Niobium (MoNb), and laminates such as a molybdenum-aluminum-molybdenum laminated structure, a MoNb-copper-MoNb laminated structure, and a AlNd-molybdenum-AlNd laminated structure.

Figure 4C:
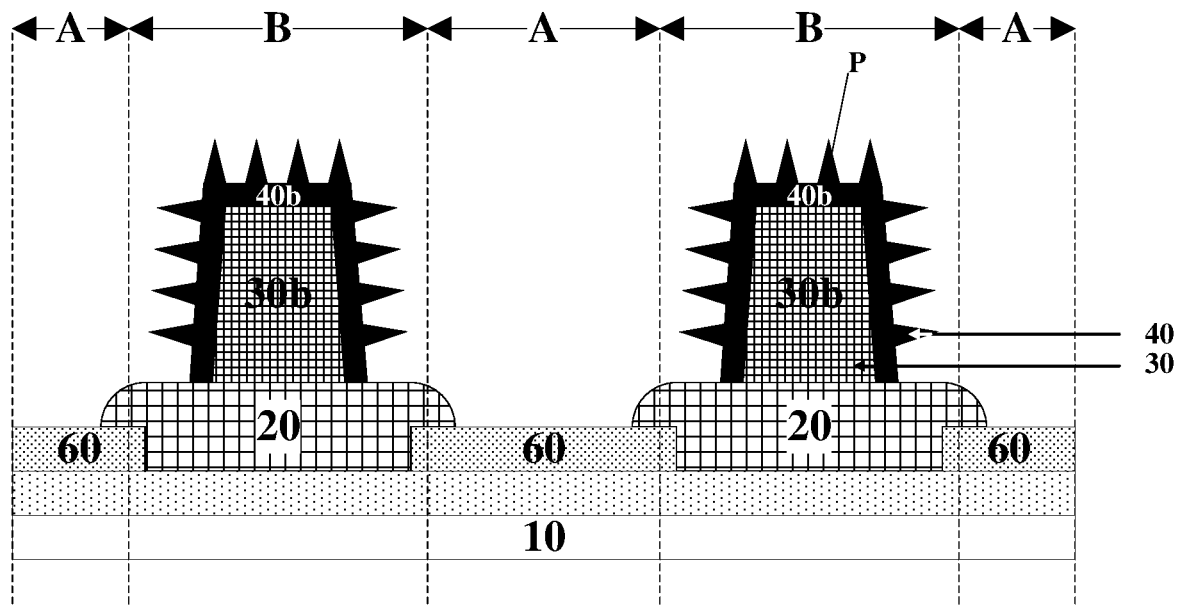

Referring to FIG. 4C, the electrode material layer 40' is further processed to form a plurality of protrusions P on a surface of the electrode material layer 40' distal to the first base substrate 10. In some embodiments, the step of forming plurality of protrusions P includes etching (e.g., dry etching) a surface of the electrode material layer 40'. Various treatment methods may be used to form the plurality of protrusions P on a surface of the electrode material layer 40' distal to the first base substrate 10. Examples of appropriate treatment methods include inductively coupled plasma (ICP) etching and reactive-ion etching (RIE). Optionally, the plurality of protrusions P are formed by patterning the electrode material layer 40' using a mask plate.

In some embodiments, and referring to FIG. 4C, the method further includes patterning the electrode material layer 40' to form a plurality of auxiliary electrode blocks 40*b* thereby forming the auxiliary electrode layer 40. Optionally, the step of forming the plurality of auxiliary electrode blocks 40*b* is performed prior to the step of forming plurality of protrusions P. Optionally, the step of forming the plurality of auxiliary electrode blocks 40*b* is performed subsequent to the step of forming plurality of protrusions P.

Figure 4D:
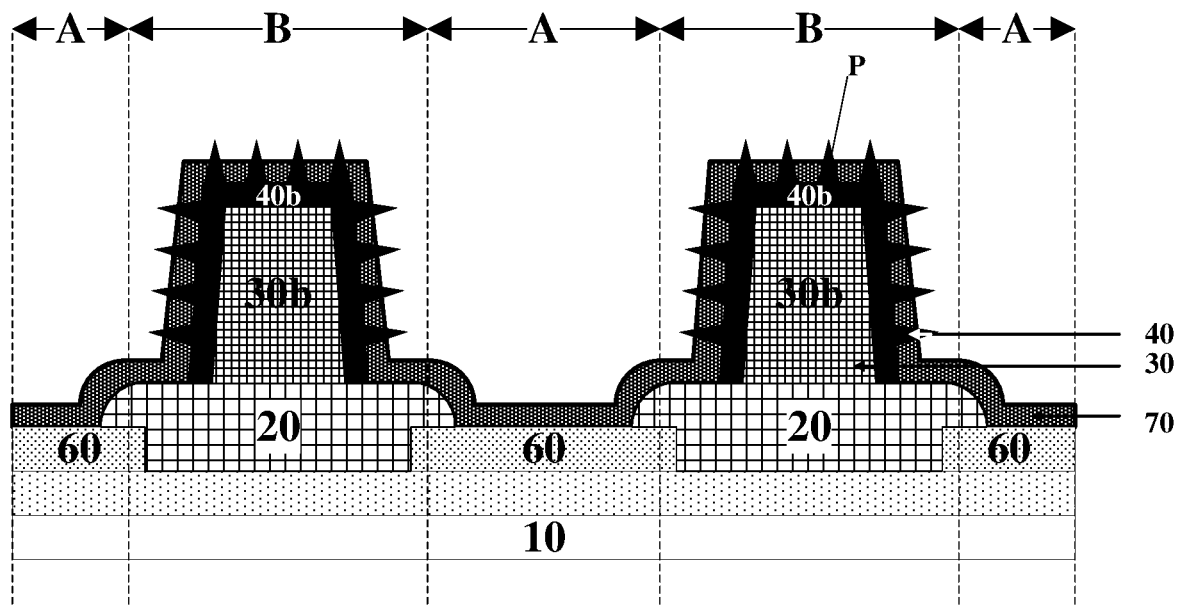

Referring to FIG. 4D, an organic light emitting layer 70 is formed in the subpixel region A on a side of the first electrode layer 60 distal to the first base substrate 10, and formed in the inter-subpixel region B on a side of the plurality of auxiliary electrode blocks 40*b* distal to the spacer layer 30.

Figure 4E:
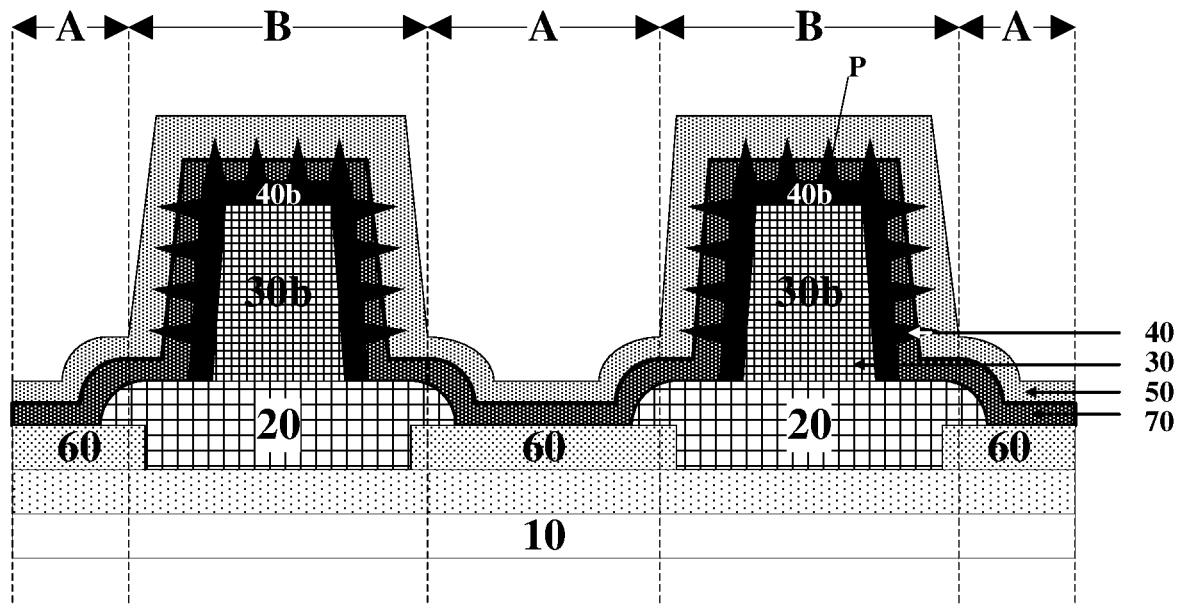

Referring to FIG. 4E, a second electrode layer 50 is formed in both the subpixel region A and at least partially in the inter-subpixel region B. The organic light emitting layer 70 is formed to extend into the inter-subpixel region B and is formed between the second electrode layer 50 and one of the plurality of auxiliary electrode blocks 40*b* in the inter-subpixel region B. In the inter-subpixel region B, the second electrode layer 50 is formed on a side of the organic light emitting layer 70 distal to the auxiliary electrode layer 40 and is electrically connected to the auxiliary electrode layer 40 through the plurality of protrusions P protruding through the organic light emitting layer 70. The plurality of protrusions P are in direct contact with the second electrode layer 50. In the subpixel region A, the second electrode layer 50 is formed on a side of organic light emitting layer 70 distal to the first electrode layer 60.

Figure 4F:
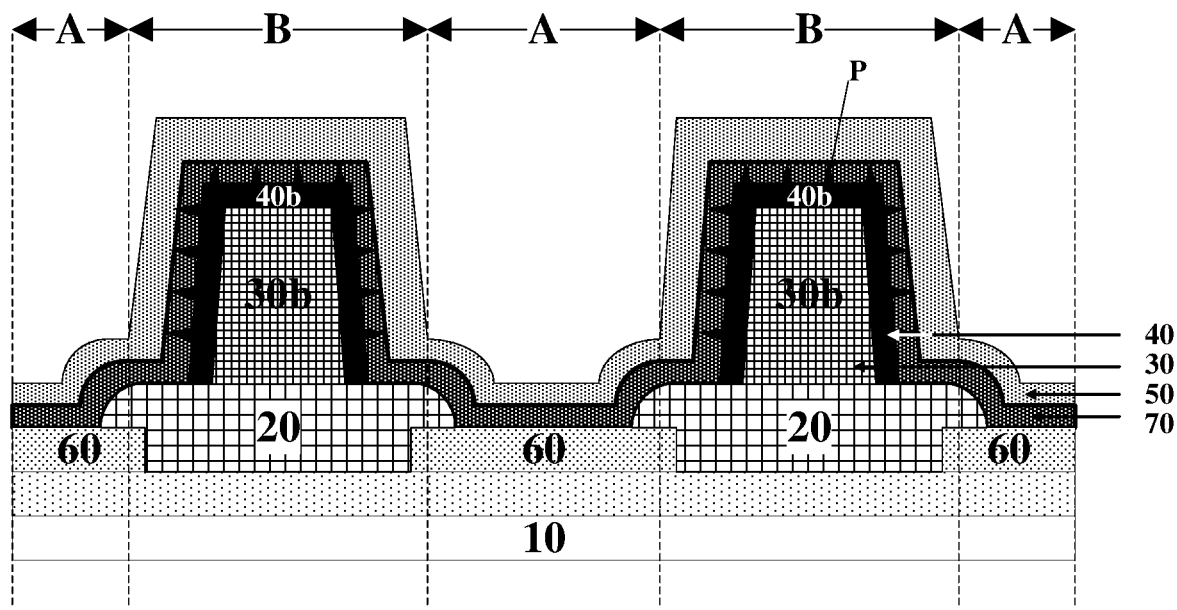

Referring to FIG. 4F, a second electrode layer 50 is formed in both the subpixel region A and at least partially in the inter-subpixel region B. In the inter-subpixel region B, the second electrode layer 50 is formed on a side of the organic light emitting layer 70 distal to the auxiliary electrode layer 40. The plurality of protrusions P in FIG. 4F have an average thickness less than an average thickness of the plurality of protrusions P in FIG. 4E. Nonetheless, at least one of the plurality of protrusions P in FIG. 4F is in direct contact with the second electrode layer 50, and electrically connects the auxiliary electrode layer 40 with the second electrode layer 50. In a subsequent process of assembling the organic light emitting diode array substrate and a counter substrate into an organic light emitting diode display panel, the organic light emitting diode array substrate and the counter substrate are pressed against each other, the plurality of protrusions P penetrate through the organic light emitting layer 70 during pressing, thereby increasing the contact and electrical connection between the auxiliary electrode layer 40 and the second electrode layer 50. In the subpixel region A, the second electrode layer 50 is formed on a side of organic light emitting layer 70 distal to the first electrode layer 60.

Figure 4G:
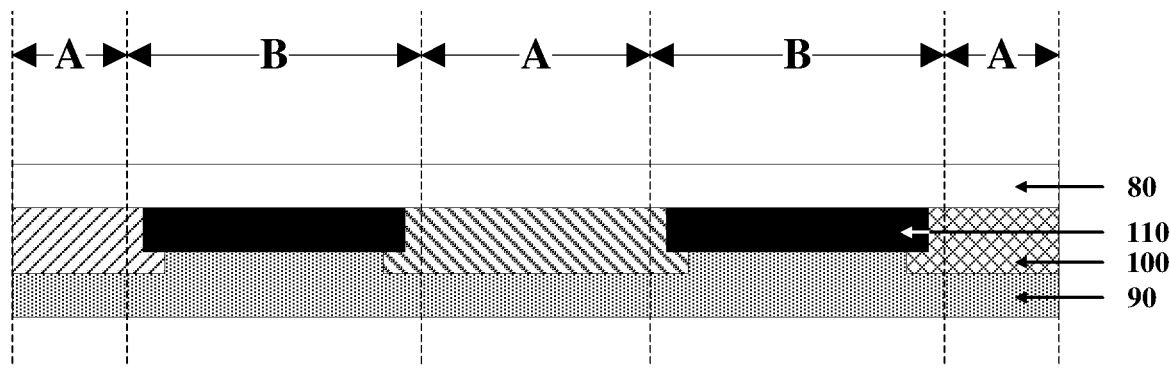

Referring to FIG. 4G, a counter substrate is fabricated by forming a black matrix layer 110 on a second base substrate 80 and in the inter-subpixel region B, forming a color filter 100 on the second base substrate 80 and in the subpixel region A, and forming an overcoat layer 90 on a side of the black matrix layer 110 and the color filter 100 distal to the second base substrate 80.

Figure 4H:
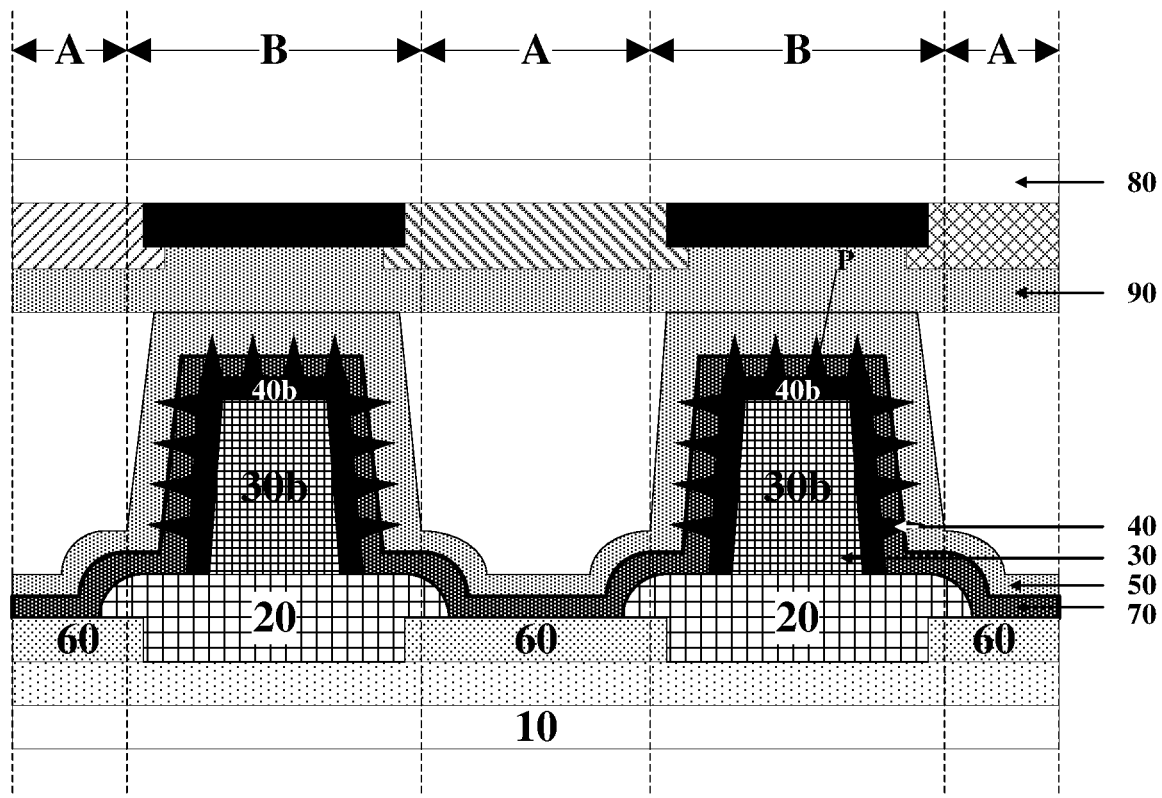

Referring to FIG. 4H, the counter substrate and the organic light emitting diode array substrate are assembled together. Optionally, the step of assembling the organic light emitting diode array substrate and the counter substrate together includes pressing the organic light emitting diode array substrate and the counter substrate against each other.

Optionally, the plurality of protrusions P penetrate through the organic light emitting layer 70 during pressing, thereby increasing contact and electrical connection between the auxiliary electrode layer 40 and the second electrode layer 50.

In some embodiments, the organic light emitting diode display panel is formed so that orthographic projections of the spacer layer 30 and the auxiliary electrode layer 40 on the pixel definition layer 20 at least partially overlap with each other. Optionally, the organic light emitting diode display panel is formed so that an orthographic projection of the auxiliary electrode layer 40 on the pixel definition layer 20 substantially covers an orthographic projection of the spacer layer 30 on the pixel definition layer 20.

In some embodiments, the organic light emitting diode display panel is formed so that an orthographic projection of each of the plurality of auxiliary electrode blocks 40b on the pixel definition layer 20 at least partially overlaps with an orthographic projection of one of the plurality of spacer blocks 30b on the pixel definition layer 20. Optionally, an orthographic projection of each of the plurality of auxiliary electrode blocks 40b on the pixel definition layer 20 substantially covers an orthographic projection of one of the plurality of spacer blocks 30b on the pixel definition layer 20.

The electrical connection between the auxiliary electrode layer 40 and the second electrode layer 50 may be achieved by various methods. In one example, subsequent to forming the organic light emitting layer, a plurality of vias are formed to extend through the organic light emitting layer, exposing the auxiliary electrode layer underneath. Subsequently, the second electrode layer is formed on a side of the organic light emitting layer distal to the auxiliary electrode layer, the second electrode layer is formed to extend through the plurality of vias, thereby electrically connecting the second electrode layer and the auxiliary electrode layer.

In another aspect, the present disclosure provides an organic light emitting diode display apparatus having an organic light emitting diode display panel described herein or fabricated by a method described herein. Examples of appropriate display apparatuses include, but are not limited to, an electronic paper, a mobile phone, a tablet computer, a television, a monitor, a notebook computer, a digital album, a GPS, etc. In one example, the display apparatus is a smart watch.

The foregoing description of the embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. An organic light emitting diode array substrate having a subpixel region and an inter-subpixel region;
   wherein the organic light emitting diode array substrate in the inter-subpixel region comprises:
   a first base substrate;
   a pixel definition layer on the first base substrate for defining a plurality of subpixels;
   a spacer layer on a side of the pixel definition layer distal to the first base substrate;
   an auxiliary electrode layer on a side of the spacer layer distal to the pixel definition layer; and
   a second electrode layer on a side of the auxiliary electrode layer distal to the spacer layer and is electrically connected to the auxiliary electrode layer;
   wherein the organic light emitting diode array substrate in the subpixel region comprises:
   the first base substrate;
   a first electrode layer on the first base substrate;
   an organic light emitting layer on a side of the first electrode layer distal to the first base substrate; and
   the second electrode layer on a side of the organic light emitting layer distal to the first electrode layer;
   wherein the spacer layer comprises a plurality of spacer blocks, each of which is on a side of the pixel definition layer distal to the first base substrate;
   the auxiliary electrode layer comprises a plurality of auxiliary electrode blocks, each of which is on a side of one of the plurality of spacer blocks distal to the pixel definition layer;
   the organic light emitting layer extends into the inter-subpixel region and is between the second electrode layer and one of the plurality of auxiliary electrode blocks in the inter-subpixel region;
   the organic light emitting diode array substrate comprises a plurality of vias extending through the organic light emitting layer in the inter-subpixel region; and
   the one of the plurality of auxiliary electrode blocks in the inter-subpixel region is electrically connected to the second electrode layer through the plurality of vias.

2. The organic light emitting diode array substrate of claim 1, wherein orthographic projections of the spacer layer and the auxiliary electrode layer on the pixel definition layer at least partially overlap with each other.

3. The organic light emitting diode array substrate of claim 1, wherein an orthographic projection of the auxiliary electrode layer on the pixel definition layer substantially covers an orthographic projection of the spacer layer on the pixel definition layer.

4. The organic light emitting diode array substrate of claim 1, wherein the one of the plurality of auxiliary electrode blocks comprises a plurality of protrusions on a side proximal to the second electrode layer and distal to the first base substrate; and the plurality of protrusions respectively protrude through the plurality of vias in the organic light emitting layer in the inter-subpixel region thereby electrically connecting the second electrode layer and the one of the plurality of auxiliary electrode blocks.

5. The organic light emitting diode array substrate of claim 4, wherein average dimensions of the plurality of protrusions are in a range of approximately 10 nm to approximately 100 nm.

6. The organic light emitting diode array substrate of claim 1, wherein an orthographic projection of each of the plurality of auxiliary electrode blocks on the pixel definition layer at least partially overlaps with an orthographic projection of one of the plurality of spacer blocks on the pixel definition layer.

7. The organic light emitting diode array substrate of claim 1, wherein an orthographic projection of each of the plurality of auxiliary electrode blocks on the pixel definition layer substantially covers an orthographic projection of one of the plurality of spacer blocks on the pixel definition layer.

8. The organic light emitting diode array substrate of claim 1, wherein the second electrode layer comprises a substantially transparent electrode material; and the auxiliary electrode layer comprises a metallic material.

9. An organic light emitting diode display panel, comprising an organic light emitting diode array substrate having a subpixel region and an inter-subpixel region; and a counter substrate facing the organic light emitting diode array substrate;

wherein the organic light emitting diode array substrate in the inter-subpixel region comprises:

a first base substrate;

a pixel definition layer on the first base substrate for defining a plurality of subpixels;

a spacer layer on a side of the pixel definition layer distal to the first base substrate;

an auxiliary electrode layer on a side of the spacer layer distal to the pixel definition layer; and a second electrode layer on a side of the auxiliary electrode layer distal to the spacer layer and is electrically connected to the auxiliary electrode layer;

wherein the spacer layer is configured to maintain a spacing between the organic light emitting diode array substrate and the counter substrate;

the spacer layer comprises a plurality of spacer blocks, each of which is on a side of the pixel definition layer distal to the first base substrate; and the auxiliary electrode layer comprises a plurality of auxiliary electrode blocks, each of which is on a side of one of the plurality of spacer blocks distal to the pixel definition layer;

wherein the counter substrate comprises:

a second base substrate; and an overcoat layer on the second base substrate;

wherein the overcoat layer is direct contact with the organic light emitting diode array substrate in each of a plurality of regions having the plurality of spacer blocks.

10. The organic light emitting diode display panel of claim 9, wherein the overcoat layer is in direct contact with the second electrode layer in each of the plurality of regions having the plurality of spacer blocks.

11. An organic light emitting diode display apparatus, comprising the organic light emitting diode display panel of claim 9.

12. A method of fabricating an organic light emitting diode display panel, comprising forming an organic light emitting diode array substrate having a subpixel region and an inter-subpixel region;

wherein forming the organic light emitting diode array substrate in the inter-subpixel region comprises:

forming a pixel definition layer on a first base substrate for defining a plurality of subpixels;

forming a spacer layer on a side of the pixel definition layer distal to the first base substrate;

forming an auxiliary electrode layer on a side of the spacer layer distal to the pixel definition layer; and forming a second electrode layer on a side of the auxiliary electrode layer distal to the spacer layer and is electrically connected to the auxiliary electrode layer;

wherein forming the spacer layer comprises forming a plurality of spacer blocks on the pixel definition layer;

forming the auxiliary electrode layer comprises:

forming an electrode material layer on a side of the spacer layer distal to the first base substrate; and forming a plurality of protrusions on a surface of the electrode material layer distal to the first base substrate.

13. The method of claim 12, wherein forming the plurality of protrusions comprises dry etching a surface of the electrode material layer.

14. The method of claim 12, subsequent to forming the plurality of protrusions, further comprising patterning the electrode material layer to form a plurality of auxiliary electrode blocks thereby forming the auxiliary electrode layer.

15. The method of claim 14, wherein forming the organic light emitting diode array substrate in the subpixel region comprises:

forming a first electrode layer on the first base substrate;

forming an organic light emitting layer on a side of the first electrode layer distal to the first base substrate; and forming the second electrode layer on a side of the organic light emitting layer distal to the first electrode layer;

wherein the organic light emitting layer is formed to extend into the inter-subpixel region and is formed between the second electrode layer and one of the plurality of auxiliary electrode blocks in the inter-subpixel region.

16. The method of claim 15, further comprising forming a counter substrate; and assembling the organic light emitting diode array substrate and the counter substrate together;

wherein assembling the organic light emitting diode array substrate and the counter substrate together comprises pressing the organic light emitting diode array substrate and the counter substrate against each other; and the plurality of protrusions penetrate through the organic light emitting layer during pressing, thereby increasing contact and electrical connection between the auxiliary electrode layer and the second electrode layer.

\* \* \* \* \*